United States Patent
Wu

[19]

[11] Patent Number: 6,069,044
[45] Date of Patent: May 30, 2000

[54] PROCESS TO FABRICATE ULTRA-SHORT CHANNEL NMOSFETS WITH SELF-ALIGNED SILICIDE CONTACT

[75] Inventor: Shye-Lin Wu, Hsinchu, Taiwan

[73] Assignee: Texas Instruments-Acer Incorporated, Hsinchu, Taiwan

[21] Appl. No.: 09/291,270

[22] Filed: Apr. 14, 1999

Related U.S. Application Data

[63] Continuation-in-part of application No. 09/050,670, Mar. 30, 1998.

[51] Int. Cl.[7] .................................................. H01L 21/336
[52] U.S. Cl. ......................... 438/299; 438/303; 438/563; 438/592
[58] Field of Search ..................... 438/299, 301, 438/303, 655, 664, 592, 563, 558, 585, 595, 305, FOR 188, FOR 177, FOR 193

[56] References Cited

U.S. PATENT DOCUMENTS

| | | | |
|---|---|---|---|
| 4,818,715 | 4/1989 | Chao | 438/303 |
| 5,447,875 | 9/1995 | Molehi | 438/305 |
| 5,705,414 | 1/1998 | Lustig | 438/585 |
| 5,753,557 | 5/1998 | Tseng | 438/303 |
| 5,814,545 | 9/1998 | Seddon et al. | 438/563 |
| 5,837,588 | 11/1998 | Wu | 438/305 |
| 5,930,617 | 7/1999 | Wu | 438/305 |

*Primary Examiner*—Michael Trinh
*Attorney, Agent, or Firm*—Harness, Dickey & Pierce, P.L.C.

[57] ABSTRACT

The method of the present invention includes the steps as followings. At first, a gate oxide layer is formed on the substrate. An undoped polysilicon layer is formed over the gate oxide layer. Then, a first dielectric layer is formed over the undoped polysilicon layer. A photoresist layer is formed over the first dielectric layer. Next, the photoresist layer is patterned to define a gate region. An etching process is performed to the photoresist layer to narrow the gate region. Portions of the first dielectric layer are etched by using the residual photoresist layer as a mask. The undoped polysilicon layer is etched by using the residual photoresist layer and the residual first dielectric layer as mask. Then, a PSG is layer deposited over the residual first dielectric layer and the substrate. Subsequently, the PSG layer is etched back to form side-wall spacers to serve as ion diffusion source. A noble or refractory metal layer is deposited on all area of the substrate. Next, a high dose arsenic or phosphorus ion implantation is performed through the metal layer to form first doped regions to serve as source and drain regions of the transistor. Finally, the two-step RTP annealing process is used to form self-aligned silicided contact of nMOSFETs.

18 Claims, 6 Drawing Sheets

PROCESS TO FABRICATE ULTRA-SHORT CHANNEL NMOSFETS WITH SELF-ALIGNED SILICIDE CONTACT

CROSS REFERENCE TO RELATED APPLICATIONS

This invention is a continuation-in-part application of an application filed under the title of "Ultra-Short Channel MOSFETs with Self-Aligned Silicide Contact", with the Ser. No. 09/050,670 filed Mar. 30, 1998, pending, wherein the application is assigned to same assignee with the same inventor as the present application.

FIELD OF THE INVENTION

The present invention relates to a semiconductor device, and more specifically, to a method of fabricating a metal oxide semiconductor field effect transistor (MOSFET).

BACKGROUND OF THE INVENTION

Metal oxide semiconductor field effect transistors (MOSFETs) have been traditionally used and widely applied in the semiconductor technologies. Device dimensions have been continuously scaled down to achieve high-performance CMOS ULSI (Ultra-Large Scale Integration) devices. For such down-scaled devices, however, parasitics such as RC delay and source/drain series resistance may easily degrade the circuit performance. As suggested in reference "M. T. Takagi, et al., in IEDM Tech. Dig. p.455, 1996", the degration factor of propagation delay on gate electrode is a relevant function of both channel width and gate electrode sheet resistance. Thus, the finite value of gate electrode sheet resistance limits the maximum channel width of which can be used in ULSIs.

Self-Aligned Ti Silicide contact source/drain and gate (Ti salicide) process is one of the candidates for low gate electrode sheet resistance and low source/drain resistance. The ultra-short channel MOSFET with self-aligned silicide contact is required for high-speed circuit. However, as mentioned in "M. Ono, et al., in IEDM Tech. Dig., p119, 1993", it is difficult to define the gate length to be below 0.1 $\mu$m due to the limitation of current optical lithography.

SUMMARY OF THE INVENTION

This invention proposes a simplified process to fabricate ultra-short channel nMOSFET with self-aligned silicide contact for high-speed device. The processes are described as follows. After growing a thin gate oxide film on silicon substrate, an undoped poly-Si or amorphous Si ($\alpha$-Si) film was deposited by LPCVD system. Then, a thin first dielectric layer and a photoresist layer were deposited. The gate region was defined on the photoresist layer. The size of the gate region defined on the photoresist layer is then narrowed by etching the photoresist layer. The dimension could be reduced to a narrower dimension then the capability of conventional lithography process. The residual photoresist layer was used as a mask to etch the first dielectric layer. The residual photoresist layer and the first dielectric layer were used as a mask to etch undoped poly-Si to form an ultra-short channel gate.

Next, a CVD PSG film was deposited and then etched back to form PSG spacers. The first dielectric layer was removed and a noble metal was deposited on the whole wafer surface. The source, drain, and gate were doped by a high dose arsenic or phosphorus implantation through the noble (or refractory) metal. Finally, the two-step RTP annealing process was used to form self-aligned silicided (salicided) contact of nMOSFETs.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to drawings. The purpose of the present invention is to provide a method for fabricating ultra-short channel nMOSFET with self-aligned silicide contact for high-speed device. The detail processes will be described as follows.

Figure 1:
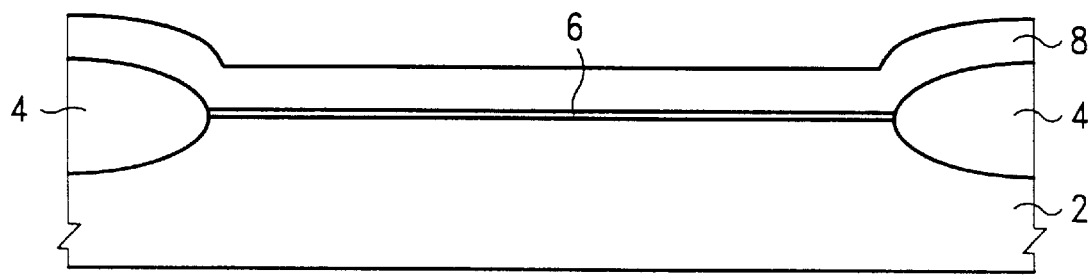
FIG. 1 is a cross-sectional view of a semiconductor substrate illustrating the step of growing a thin gate oxide layer and forming an undoped poly-Si layer on a semiconductor substrate according to the present invention.

Please reference to FIG. 1. In a preferred embodiment, a single crystal silicon substrate 2 with a <100> crystallographic orientation is provided. A plurality of thick field oxide (FOX) regions 4 are formed to provide isolation between devices on the substrate. As an example, the FOX regions 4 can be formed via lithography and etching steps to etch a silicon nitride-silicon dioxide composition layer. After the photoresist is removed and wet cleaned, thermal oxidation in an oxygen-steam environment is used to grow the FOX region 4 to a thickness about 3000–8000 angstroms.

The FOX region 4 can also be replaced by a plurality of shallow trench isolations, as well known in the art. Next, a silicon dioxide layer 6 is formed on the top surface of the substrate 2 to serve as a gate oxide layer. Typically, the silicon dioxide layer 6 is formed in oxygen ambient at a temperature of about 700 to 1100 Centigrade degrees. In this embodiment, the thickness of the silicon dioxide layer is approximately 15 to 250 angstroms. Alternatively, the oxide layer 6 may be formed using any suitable oxide chemical compositions and procedures.

An undoped polysilicon layer 8 is then deposited on the FOX regions 4 and the silicon dioxide layer 6 using a low-pressure chemical vapor deposition process. The undoped poly-Si layer 8 can be replaced by amorphous-Si layer. In an embodiment, the thickness of the undoped polysilicon layer 8 is about 500 to 3000 angstroms.

Figure 2:
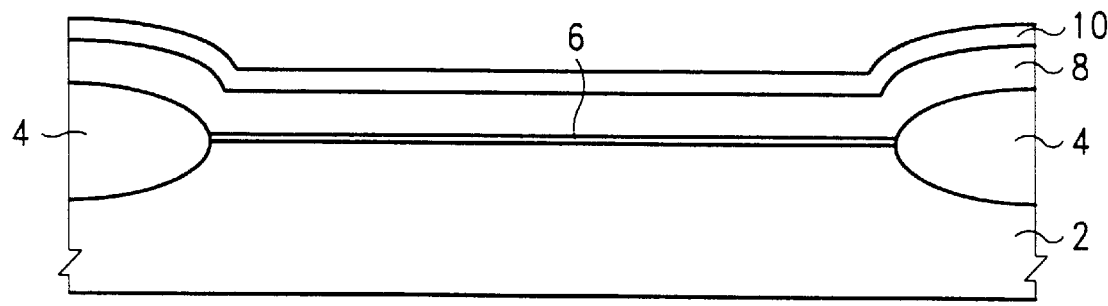
FIG. 2 is a cross-sectional view of a semiconductor substrate illustrating the step of forming a first dielectric layer on the undoped poly-Si layer according to the present invention.

Referring to FIG. 2, a first dielectric layer 10 is deposited on the undoped poly-Si layer 8. In this preferred embodiment, the thickness of the first dielectric layer 10 is approximately 100 to 2000 angstroms. The first dielectric layer 10 can be a silicon oxynitride layer, a silicon oxide layer, or a silicon nitride layer.

Figure 3:
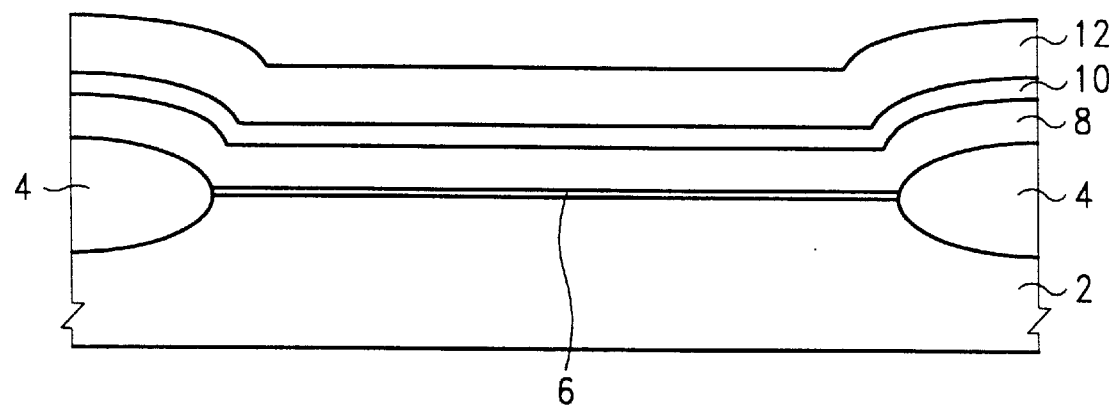
FIG. 3 is a cross-sectional view of a semiconductor substrate illustrating the step of forming second silicon on the first dielectric layer according to the present invention.

Turning to FIG. 3, a second silicon layer 12 is deposited on the first dielectric layer 10. In a preferred embodiment, the thickness of the second silicon layer 12 is approximately 500 to 3000 angstroms. The second silicon layer can be an undoped silicon layer or a doped silicon layer, like a n+ doped poly-Si layer.

Figure 4:
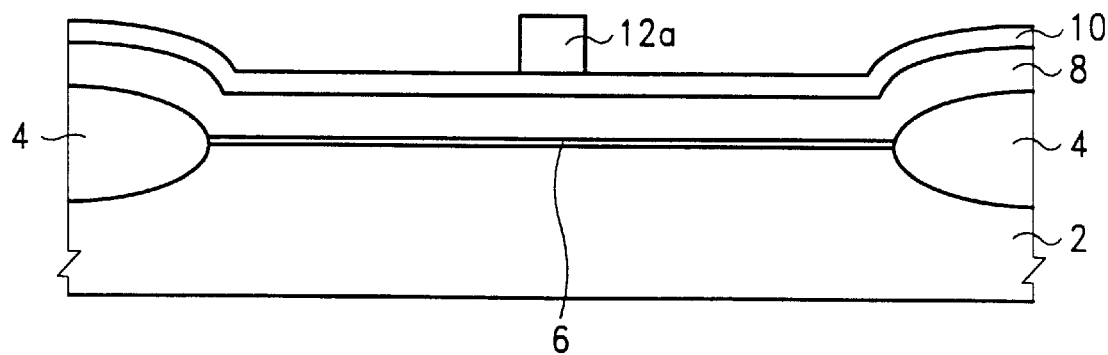
FIG. 4 is a cross-sectional view of a semiconductor substrate illustrating the step of defining a gate region according to the present invention.

Next, referring to FIG. 4, a gate region 12a is defined to etch back the second silicon layer 12 by using a photoresist layer as a mask. In the case of using a silicon oxynitride layer as the first dielectric layer 10, the silicon oxynitride layer can serve as an anti-reflection coating (ARC) to improve the accuracy of the lithography process in defining the gate region 12a.

Figure 5:
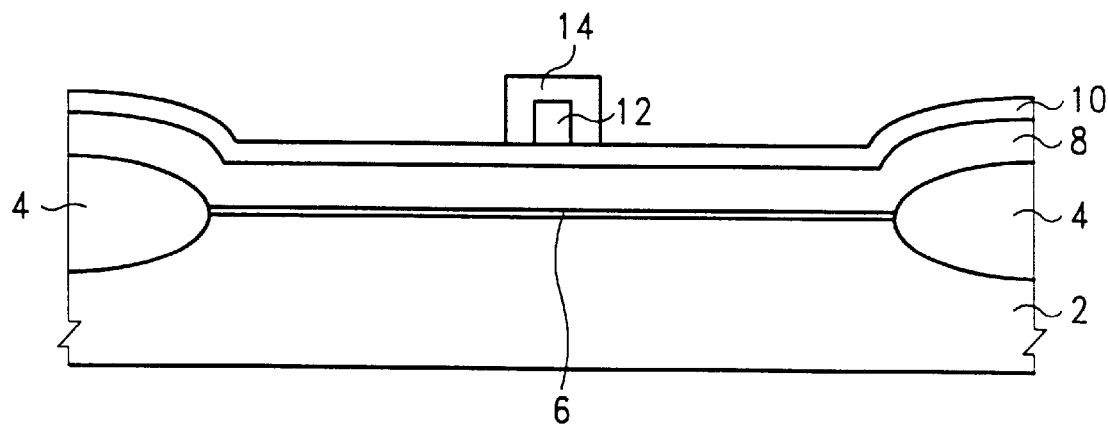
FIG. 5 is a cross-sectional view of a semiconductor substrate illustrating the step of performing a low temperature oxidation on second silicon layer according to the present invention.
Figure 6:
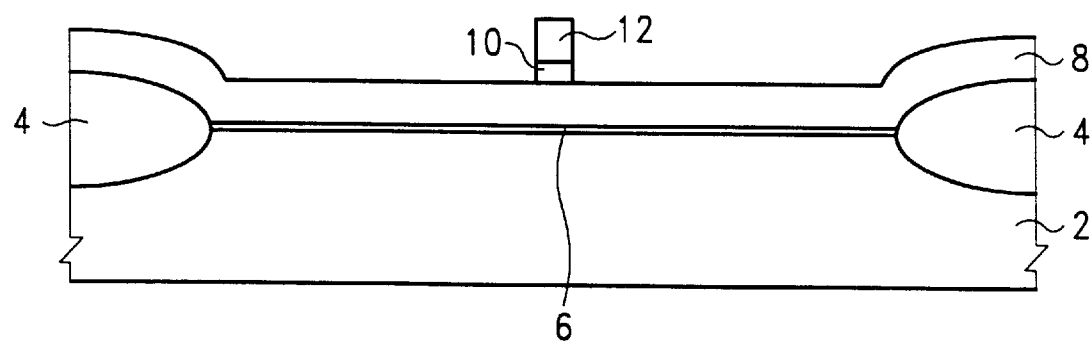
FIG. 6 is a cross-sectional view of a semiconductor substrate illustrating a narrowed gate region and the etching of the first dielectric layer according to the present invention.

Turning to FIG. 5, a low temperature steam oxidation process is subsequently carried out to oxidize the residual second silicon layer 12. After the oxidation process is performed, a thermal polyoxide film 14 will grow on the surface of the residual second silicon layer 12. In a preferred embodiment, the low temperature steam oxidation is performed at a temperature range about 700 to 900 centigrade degrees for 5~60 minutes. Besides, the low temperature steam oxidation can be instead by a low temperature dry oxidation process. At this step, the size of the residual second silicon film 12 could be reduced. Referring to FIG. 6, the thermal polyoxide film 14 is removed by BOE or dilute HF solution.

In another preferred embodiment, the size of the gate region 12a can be narrowed down by an etching process. As an example, an isotropic dry etching process can be performed. In the preferred embodiments, the isotropic dry etching can be performed with a plasma etching using a major reaction gas selected from chlorine-based gases. The size of the gate region 12a in FIG. 4 is narrowed to the residual second silicon region 12 as shown in FIG. 6.

In some other embodiments of the present invention, the second silicon layer 12 can be replaced with a photoresist layer. The photoresist layer 12 can be defined with the gate region by directly applying a lithography process. The size of the gate region defined by the photoresist layer 12 is then preferably narrowing down by a dry etching process, such as a photoresist stripping process with an oxygen based plasma.

By the aforementioned methods, the size of the residual second silicon layer or residual photoresist layer 12 can be narrowed down without being limited by the conventional lithography processes. In present stage lithography process, the minimum dimension which can be accurately defined is about 0.1 to 1.0 micrometer. However, having the proposed methods of the present invention, the size of the residual photoresist layer 12 can be narrowed down to about 0.1 micrometer to 10 nanometer, or even narrower, without being limited by the lithography processes.

Next, the residual second silicon layer (or the photoresist layer) 12 is used as a hard mask to etch the first dielectric layer 10, as shown in FIG. 6. In a preferred embodiment, the first dielectric layer 10 is removed by a dry etching process. The plasma etchant can be chosen from the group of $CF_4/O_2$, $CHF_3$, $C_2F_6$, or $SF_6/He$.

Figure 7:
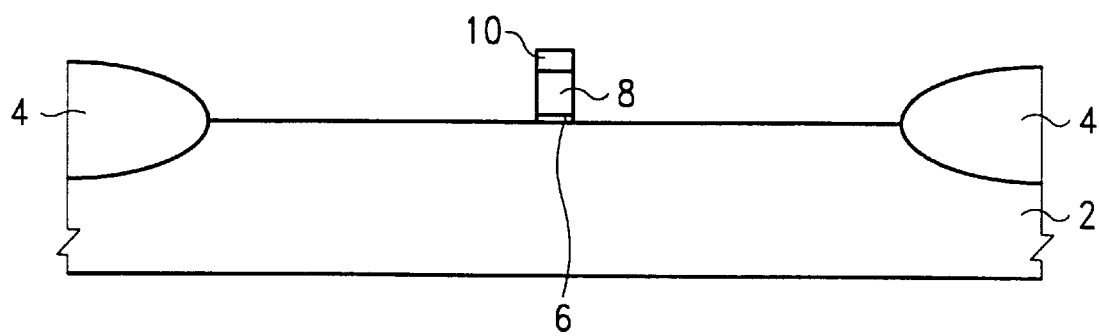
FIG. 7 is a cross-sectional view of a semiconductor substrate illustrating the step of etching the undoped poly-Si layer by using the residual second silicon layer as a hard mask according to the present invention.

Subsequently, we use the residual second silicon layer 12 and first dielectric layer 10 as a mask to etch the undoped poly-Si layer 8 to form an ultra-short channel gate as shown in FIG. 7. The etchant can be chosen from the group of $SiCl_4/Cl_2$, $BCl_3/Cl_2$, $Br_2/SF_6$. Therefore, the gate structure 8, as shown in FIG. 7, which is formed with the method of the present invention, can have a much more narrower size of about 0.1 micrometer to 10 nanometer, or even narrower.

Figure 8:
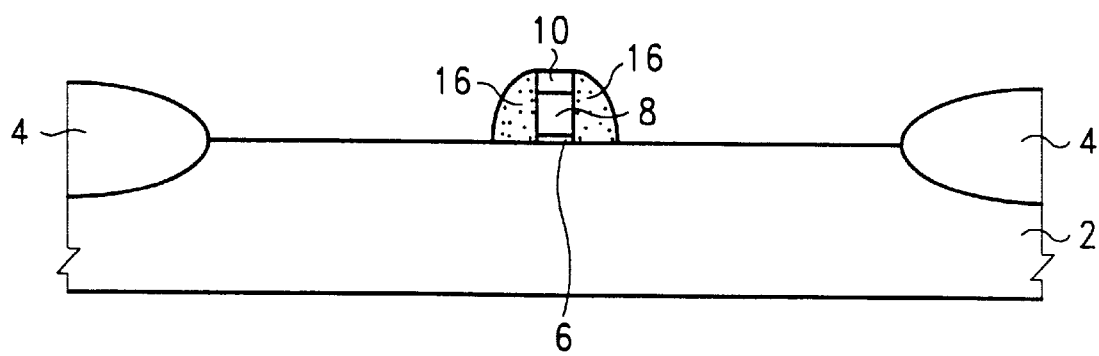
FIG. 8 is a cross-sectional view of a semiconductor substrate illustrating the step of forming a PSG oxide side-wall spacers according to the present invention.

Next referring to FIG. 8, a phosphosilicate glass (PSG) oxide film 16 is deposited over the FOX 4 (BSG oxide film for pMOSFET), the undoped poly-Si gate 8, and the substrate 2 by chemical vapor deposition system. Next, an anisotropic etching is performed on the PSG oxide film 16 to form PSG oxide side-wall spacers 16 on the side walls of the gate 8. In this preferred embodiment, the PSG oxide layer 16 is served as a diffusion source to form the extended S/D junction for the minimum junction depth requirement.

Figure 12:
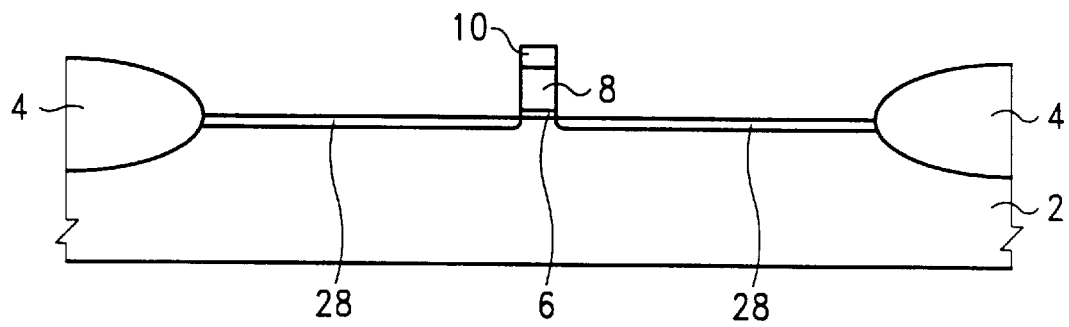
FIG. 12 is a cross-sectional view of a semiconductor substrate illustrating the step of forming extended S/D junction by plasma immersion or low energy implantation.

In some other preferred embodiments, ultra-shallow extended source drain junctions 28 can be formed by plasma immersion or low energy implantation processes, as shown in FIG. 12. The plasma immersion process can be performed in a plasma environment with the presence of phosphorus or arsenic ions to in the case of forming nMOSFETs. The low energy implantation process can be performed by implanting phosphorus or arsenic ions at an energy between about 0.1 to 5 KeV, preferably for having a dosage of about 1E13 to 1E15 ions/cm². Alternatively, boron ions can employed to replace phosphorus or arsenic ions in the methods mentioned above to fabricate pMOSFETs.

Figure 13:
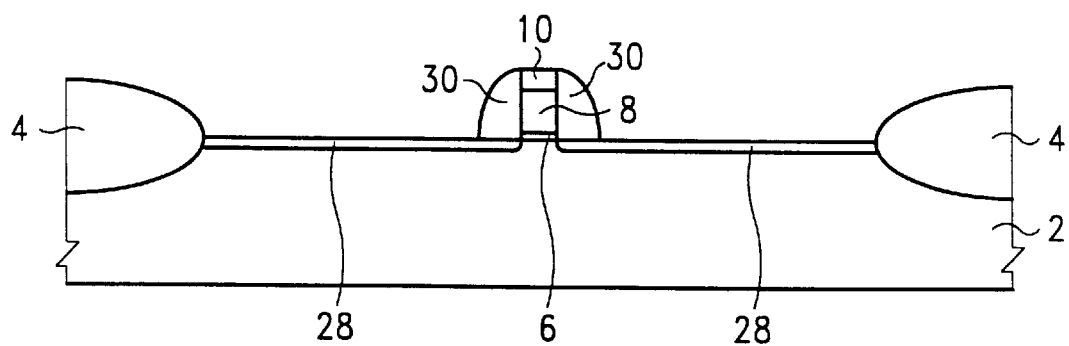
FIG. 13 is a cross-sectional view of a semiconductor substrate illustrating the step of forming undoped side-wall spacers according to the present invention.

Turning to FIG. 13, undoped side-wall spacers 30 are then formed in the case of forming directly the ultra-shallow extended source drain junctions 28. Materials such as silicon oxide, silicon nitride, stacked silicon oxide and nitride, and silicon oxynitride can be employed as the undoped side-wall spacers 30. After the undoped side-wall spacers 30 are formed, the following steps for forming silicide contacts are basically the same as the case of employing the PSG spacers 16, and are not further described in detail.

Figure 9:
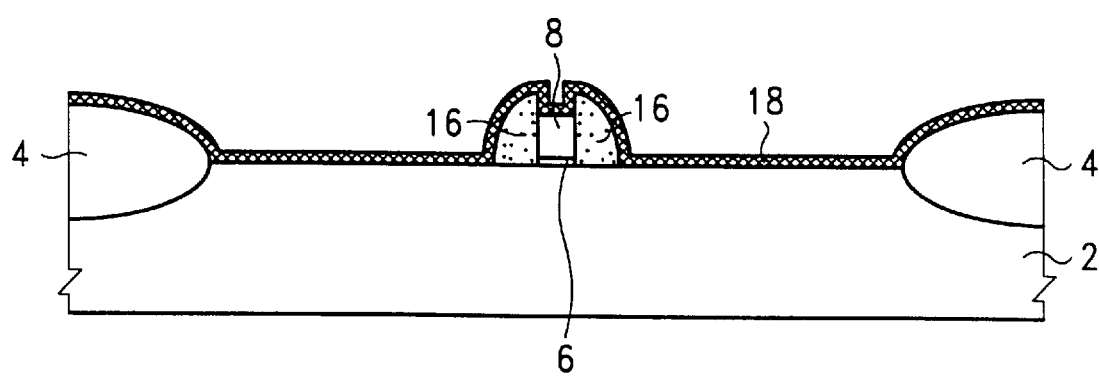
FIG. 9 is a cross-sectional view of a semiconductor substrate illustrating the step of removing the first dielectric layer and then sputtering the noble or refractory metal on the gate and the substrate according to the present invention.

Turning to FIG. 9, the first dielectric film 10 is then removed with wet etch. As an example, the first dielectric film 10 of silicon nitride can be removed by hot $H_3PO_4$ solution. Following removal of the first dielectric film 10, a noble or refractory metal layer 18 is subsequently deposited over all area of the substrate 2. In this preferred embodiment, the noble metal can be chosen from the group of Ti, W, Co, Pt, Ni, Cr, and etc.

Figure 10:
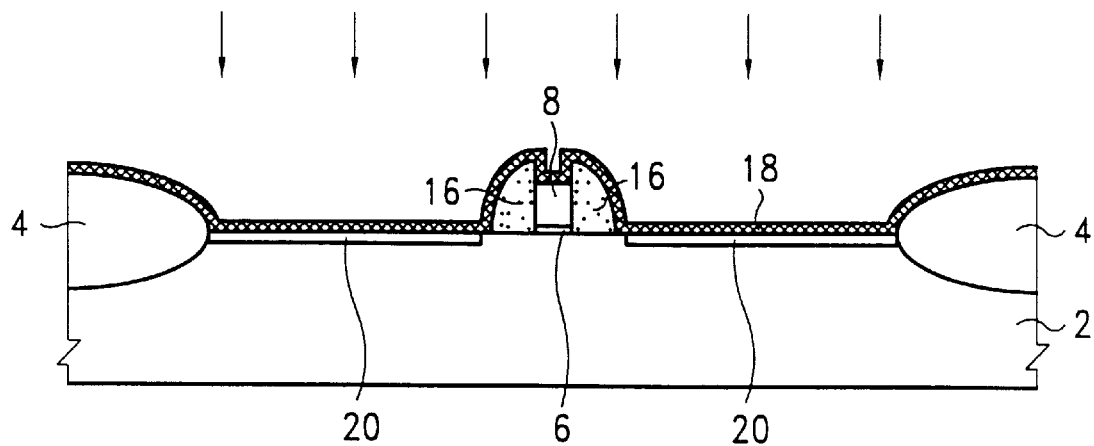
FIG. 10 is a cross-sectional view of a semiconductor substrate illustrating the step of performing an ion implantation to form the source and drain according to the present invention.
Figure 14:
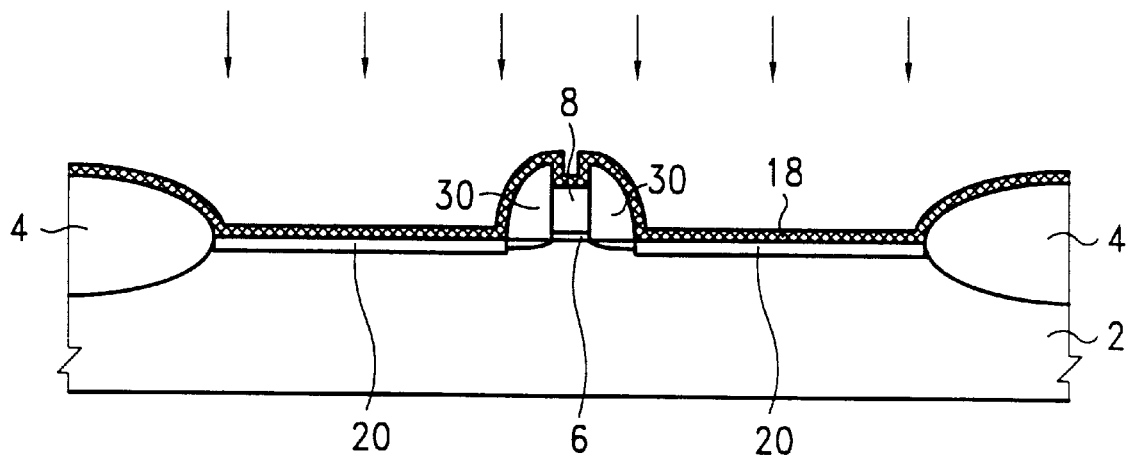
FIG. 14 is a cross-sectional view of a semiconductor substrate illustrating the step of performing an ion implantation to form the source and drain according to the example of empolying undoped spacers in the present invention.

Referring to FIG. 10, a high dosage arsenic or phosphorus ion implantation is performed through the metal layer 18 to form source/drain regions 20 in the substrate 2 using the gate 8 and the side-wall spacers 16 or 30 as mask. In a preferred embodiment, the implantation energy is about 5 to 150 KeV, the dosage of the implantation is about $5 \times 10^{14}$ to $5 \times 10^{16}$ ions/cm$^2$. For fabricating pMOSFETs, boron ions can be employed to replace aforementioned arsenic or phosphorus ions. For the case of employing undoped side-wall spacers 30 at the gate, the structure after high dosage arsenic or phosphorus ion implantation is illustrated in FIG. 14.

Figure 11:
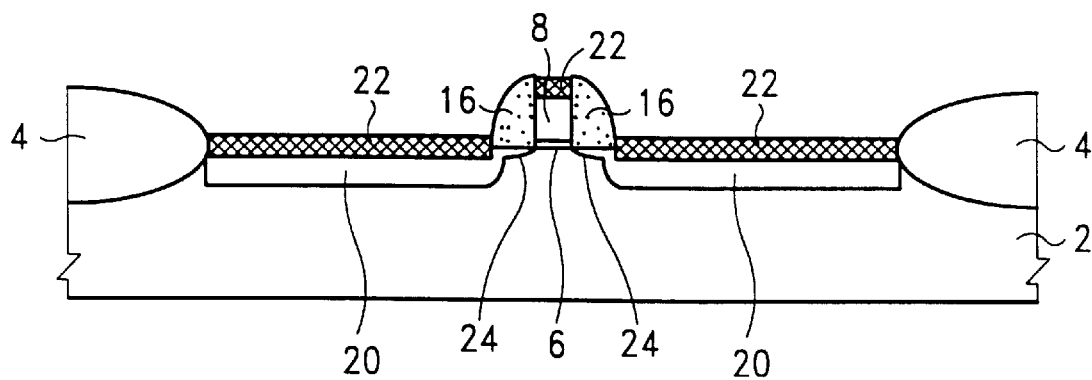
FIG. 11 is a cross-sectional view of a semiconductor substrate illustrating the step of performing two-step RTP process to form SALICIDE and extended S/D junction according to the present invention.

Referring to FIG. 11, in order to form salicided contact 22 and extended S/D junction 24, a two-step thermal process or RTP (rapid thermal process) is carried out. The first rapid thermal process for annealing is performed to form metal silicide 22 on the top surface of the gate 8, and the surface of the source/drain regions 20 in substrate 2. In this preferred embodiment, a first step RTP process is performed to form salicide 22 at the temperature about 300 to 700 Centigrade degree for 30~180 seconds. In the case of using PSG spacers 16, some of the dopants are driven in with the first step RTP.

Figure 15:
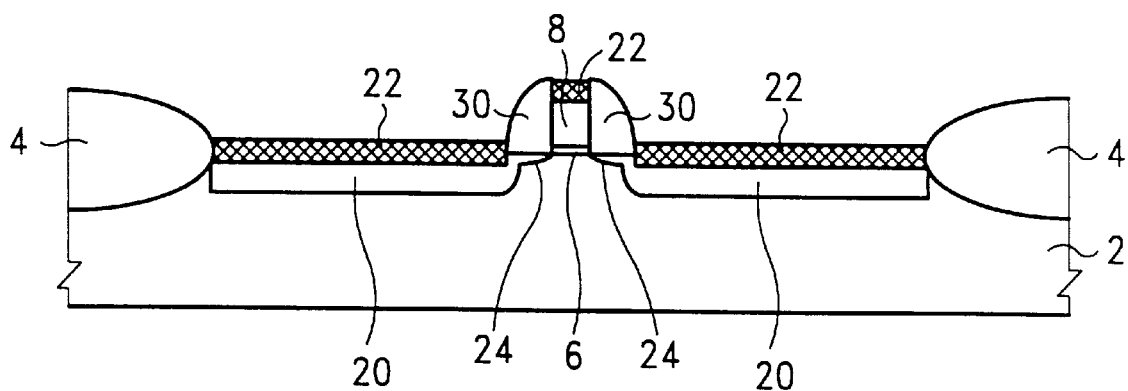
FIG. 15 is a cross-sectional view of a semiconductor substrate illustrating the step of performing two-step RTP process to form SALICIDE and extended S/D junction according to the example of empolying undoped spacers in the present invention.

The remaining non-reacted metal layer 18 is etched to leave the metal silicide 22 on the top surface of gate 8 and in source and drain regions 20. Next, a second RTP process is performed to further drive the impurities in PSG spacers to form extended source and drain junction 24 and transform the metal silicide 22 into a stabilized phase for providing improved electrical characteristics. In this preferred embodiment, the second rapid thermal process for annealing is performed at the temperature about 700 to 1150 Centigrade degree for 10~100 seconds. For the case of employing undoped side-wall spacers 30 at the gate, the structure after two-step thermal process or RTP or phosphorus ion implantation is illustrated in FIG. 15.

With the aforementioned method of PSG spacers, plasma immersion, or low energy implantation to form the extended S/D junction, an ultra-shallow extended S/D junctions can be provided.

With the aforementioned embodiments, the present invention propose a transistor in a semiconductor substrate with self-aligned silicide contact. A metal oxide semiconductor field effect transistor (MOSFETs) having a gate as narrow as about 0.1 micrometer to 10 nanometer, or even narrower, is provided. Referring to FIG. 11, the transistor includes a gate structure 8, side-wall spacers 16, source and drain regions 20, a conductive silicide contact 22, and extended source and drain regions 24. The gate structure 8 is formed on the substrate. The gate structure 8 has a width between about 0.1 micrometer to 10 nanometer or narrower. The side-wall spacers 16 are formed on the side walls of the gate structure 8. The source and drain regions 20 are formed in the substrate 2. The conductive silicide contact 22 is formed on the top surface of the gate structure 8, and also on the surface of the source and drain regions 20. The extended source and drain regions 24 are formed right under the side-wall spacers and connected next to the source and drain regions 20. Having the the removal of the residual first dielectric layer in the proposed method, the silicide contact 22 on the top surface of the gate structure 8 is recessed from the top of the side-wall spacers 16.

The benefits of this invention are (1) an ultra-short channel salicided contact nMOSFET could be obtained by using the current lithography technology; and (2) an extended ultra-shallow S/D junction could be formed by using the method disclosed to improve the short channel effect.

As is understood by a person skilled in the art, the foregoing preferred embodiment of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention. For example, this method that we proposed for fabricating ultra-short channel nMOSFETs devices with self-aligned silicided contact (for nMOSFET PSG could be used for extended S/D junction) also can use in fabricating pMOFETS(for pMOSFET BSG could be used for extended S/D junction) or CMOSFETs.

I claim:

1. A method for fabricating an ultra-short channel transistor in a semiconductor substrate with self-aligned silicide contact, said method comprising the steps of:

forming a gate oxide layer on said substrate;

forming a first silicon layer over said gate oxide layer;

forming a first dielectric layer over said first silicon layer;

forming a photoresist layer over said first dielectric layer;

patterning said photoresist layer to define a gate region;

performing an etching process to said photoresist layer to narrow a size of said gate region;

etching portions of said first dielectric layer by using a residual photoresist layer as a mask;

etching said first silicon layer by using said residual photoresist layer and said residual first dielectric layer as a mask;

removing said residual photoresist layer;

forming a second dielectric layer over said residual first dielectric layer and said substrate;

etching said second dielectric layer to form side-wall spacers to serve as an ion diffusion source;

removing said residual first dielectric layer;

forming a metal layer on the surface of said side-wall spacers, said residual first silicon layer, and said substrate;

performing an ion implantation through said substrate to form first doped regions to serve as source and drain regions of said transistor; and performing a first thermal annealing to form metal silicide layer on the surface of said substrate and on the top surface of said residual first silicon layer.

2. The method of claim 1 further comprising the step of etching non-reacted portions of said metal layer, thereby leaving said metal silicide on the top surface of said residual first silicon layer and on the source and drain regions after said first thermal annealing process.

3. The method of claim 2 further comprising the step of performing a second thermal annealing, after etching said metal layer.

4. The method of claim 3, wherein said second thermal annealing is performed at a temperature about 700 to 1150 Centigrade degree for about 10~100 seconds.

5. The method of claim 1, wherein said first silicon layer is an undoped polysilicon layer.

6. The method of claim 5, wherein said undoped polysilicon layer has a thickness of about 500 to 3000 angstroms.

7. The method of claim 1, wherein said first dielectric layer is selected from the group consisting of silicon oxynitride, silicon oxide and silicon nitride.

8. The method of claim 1, wherein said first dielectric layer has a thickness of about 100 to 2000 angstroms.

9. The method of claim 1, wherein said etching process to said photoresist layer is performed by a dry etch.

10. The method of claim 1, wherein said etching process to said photoresist layer is performed with an oxygen plasma.

11. The method of claim 1, wherein said second dielectric layer is a phosphosilicate glass (PSG) oxide layer.

12. The method of claim 11, wherein said PSG layer have a thickness about 200 to 1500 angstroms.

13. The method of claim 1, wherein said ion implantation has a dosage of about $5 \times 10^{14}$ to $5 \times 10^{16}$ ions/cm$^2$.

14. The method of claim 1, wherein said first thermal annealing is performed at a temperature about 300 to 700 Centigrade degree for about 30~180 seconds.

15. A method for fabricating an ultra-short channel transistor in a semiconductor substrate with self-aligned silicide contact, said method comprising the steps of:

forming a gate oxide layer on said substrate;

forming a first silicon layer over said gate oxide layer;

forming a first dielectric layer over said first silicon layer, said first dielectric layer being selected from the group consisting of silicon oxynitride and silicon oxide;

forming a photoresist layer over said first dielectric layer;

pattering said photoresist layer to define a gate region;

performing an etching process to said photoresist layer to narrow a size of said gate region;

etching portions of said first dielectric layer by using a residual photoresist layer as a mask;

etching said first silicon layer by using said residual photoresist layer and said residual first dielectric layer as a mask;

removing said residual photoresist layer;

forming a second dielectric layer over said residual first dielectric layer and said substrate;

etching said second dielectric layer to form side-wall spacers to serve as an ion diffusion source;

removing said residual first dielectric layer;

forming a metal layer on the surface of said side-wall spacers, said residual first silicon layer, and said substrate;

performing an ion implantation through said substrate to form first doped regions to serve as source and drain regions of said transistor;

performing a first thermal annealing to form metal silicide layer on the surface of said substrate and on the top surface of said residual first silicon layer;

etching non-reacted portions of said metal layer, thereby leaving said metal silicide on the top surface of said residual first silicon layer and on the source and drain regions; and performing a second thermal annealing.

16. The method of claim 15, wherein said first silicon layer is an undoped polysilicon layer.

17. The method of claim 15, wherein said etching process to said photoresist layer is performed by a dry etch.

18. The method of claim 15, wherein said second dielectric layer is a phosphosilicate glass (PSG) oxide layer.

* * * * *